US011457304B1

(12) United States Patent
Nielsen

(10) Patent No.: US 11,457,304 B1
(45) Date of Patent: Sep. 27, 2022

(54) HEADPHONE AUDIO CONTROLLER

(71) Applicant: Bose Corporation, Framingham, MA (US)

(72) Inventor: Ole Mattis Nielsen, Cambridge (GB)

(73) Assignee: Bose Corporation, Framingham, MA (US)

( * ) Notice: Subject to any disclaimer, the term of this patent is extended or adjusted under 35 U.S.C. 154(b) by 0 days.

(21) Appl. No.: 17/562,142

(22) Filed: Dec. 27, 2021

(51) Int. Cl.

| | |
|---|---|
| ***G10K 11/16*** | (2006.01) |
| ***H03B 29/00*** | (2006.01) |
| ***H04R 1/10*** | (2006.01) |
| ***G10K 11/178*** | (2006.01) |

(52) U.S. Cl.
CPC ..... *H04R 1/1083* (2013.01); *G10K 11/17881* (2018.01); *G10K 2210/1081* (2013.01); *G10K 2210/3026* (2013.01); *G10K 2210/3027* (2013.01); *H04R 2460/01* (2013.01)

(58) Field of Classification Search
CPC ........................ H04R 1/1083; G10K 11/17881
See application file for complete search history.

(56) References Cited

U.S. PATENT DOCUMENTS

| | | | | |
|---|---|---|---|---|
| 10,096,313 | B1 * | 10/2018 | terMeulen | G10K 11/178 |
| 10,748,521 | B1 * | 8/2020 | Mulvey | G10K 11/17819 |
| 10,937,410 | B1 | 3/2021 | Rule | |
| 2017/0200444 | A1 * | 7/2017 | O'Connell | G10K 11/17885 |
| 2020/0183644 | A1 * | 6/2020 | Risberg | H04R 29/001 |
| 2020/0219477 | A1 * | 7/2020 | Honda | G10K 11/17881 |
| 2021/0400398 | A1 * | 12/2021 | McCutcheon | G10K 11/17813 |
| 2022/0157291 | A1 * | 5/2022 | McCutcheon | H04R 1/1083 |

* cited by examiner

*Primary Examiner* — Simon King
(74) *Attorney, Agent, or Firm* — Bose Corporation

(57) ABSTRACT

A method of determining an audio controller for a headphone that is configured to use an acoustic transducer to develop sound that is delivered to an ear of a user and that includes a feedback microphone that is configured to sense sound developed by the acoustic transducer, and a related computer program product and system. A first audio transfer function between the acoustic transducer and the feedback microphone is measured. A second audio transfer function between the acoustic transducer and the feedback microphone with a feedback controller applied is determined. The audio controller is calculated based on both the first audio transfer function and the second audio transfer function.

20 Claims, 5 Drawing Sheets

HEADPHONE AUDIO CONTROLLER

BACKGROUND

This disclosure relates to controlling an audio headphone.

Headphones can be controlled with the aim of providing a particularly equalized sound. Headphones with active noise reduction (ANR) sometimes include a transparency or aware mode where external sounds are sensed by an external microphone and reproduced to the user. Such headphones can also be controlled to provide a desired transparency sound profile.

SUMMARY

Aspects and examples are directed to determining audio controllers for one or both of headphone equalization (EQ) and headphone aware mode. The controllers are calculated during use (on the fly) based at least in part on an audio transfer function that is measured between an acoustic transducer of the headphones and a microphone that senses the transducer output (e.g., a feedback microphone in ANR headphones), and further based on this same transfer function but determined with a feedback controller turned on. A result is that the EQ and aware mode controllers are customized for the particular user, without any action needing to be taken by the user or others. This provides a more consistent listening experience across large populations of users.

All examples and features mentioned below can be combined in any technically possible way.

In one aspect a method of determining an audio controller for a headphone that is configured to use an acoustic transducer to develop sound that is delivered to an ear of a user and that includes a feedback microphone that is configured to sense sound developed by the acoustic transducer includes measuring a first audio transfer function between the acoustic transducer and the feedback microphone, determining a second audio transfer function between the acoustic transducer and the feedback microphone with a feedback controller applied, and calculating the audio controller based on both the first audio transfer function and the second audio transfer function.

Some examples include one of the above and/or below features, or any combination thereof. In an example measuring the first audio transfer function comprises providing an audio signal that is configured to operate the acoustic transducer to generate sound, sensing the sound with the feedback microphone, and calculating the first audio transfer function based on the audio signal and the sensed sound. In some examples determining the second audio transfer function comprises measuring an audio transfer function between the acoustic transducer and the feedback microphone with a feedback controller applied. In an example measuring an audio transfer function between the acoustic transducer and the feedback microphone with a feedback controller applied comprises providing an audio signal that is configured to operate the acoustic transducer to generate sound, sensing the sound with the feedback microphone, and calculating the second audio transfer function based on the audio signal, the sensed sound, and the feedback controller.

Some examples include one of the above and/or below features, or any combination thereof. In some examples determining the second audio transfer function comprises calculating the second audio transfer function based on both the first audio transfer function and the feedback controller. In an example the audio controller comprises an equalization (EQ) controller. In an example the audio controller comprises a controller for a headphone use aware mode wherein sound external to the headphone is reproduced by the acoustic transducer.

Some examples include one of the above and/or below features, or any combination thereof. In some examples the method further includes providing a measured power spectrum for a microphone located in an ear canal of a person, and providing a measured power spectrum for a microphone located on the person's head. In some examples the power spectra are measured on multiple different people. A compilation or sort of average of the values from this dataset can then be used in the headphones. In an example the calculation of the audio controller is further based on both the measured power spectrum for a microphone located in an ear canal of a person and the measured power spectrum for a microphone located on the person's head. In an example the calculation of the audio controller is further based on a third audio transfer function between an acoustic transducer and a microphone located in an ear canal of a person.

Some examples include one of the above and/or below features, or any combination thereof. In some examples the method further includes providing a third audio transfer function between a first location of a feedback microphone in an ear canal of a person and a second location on the person's head. In an example the method still further includes providing a fourth audio transfer function between the acoustic transducer and the first location of a feedback microphone in an ear canal of a person. In an example the second, third, and fourth audio transfer functions are each calculated by providing an audio signal to an acoustic transducer, sensing transduced sounds with a microphone, and calculating the transfer function based on the audio signal and the sensed sound. In some examples an audio transfer function is measured on the user in real time. As further explained below, in some examples data derived from measurements made on multiple people in a controlled environment are used together with the measured transfer function to calculate one or both of the aware mode and EQ audio controllers.

Some examples include one of the above and/or below features, or any combination thereof. In an example the method further includes providing first and second constant values. In an example the first and second constant values are calculated based on both the third and fourth audio transfer functions. In an example the first and second constant values are calculated based on both the third and fourth audio transfer functions at multiple different fits of the headphone on multiple different people. In an example the first and second constant values represent frequency-dependent complex quantities.

In another aspect a computer program product having a non-transitory computer-readable medium including computer program logic encoded thereon that, when performed on a headphone that is configured to use an acoustic transducer to develop sound that is delivered to an ear of a user and that includes a feedback microphone that is configured to sense sound developed by the acoustic transducer, causes the headphone to measure a first audio transfer function between the acoustic transducer and the feedback microphone, determine a second audio transfer function between the acoustic transducer and the feedback microphone with a feedback controller applied, and calculate the audio controller based on both the first audio transfer function and the second audio transfer function.

Some examples include one of the above and/or below features, or any combination thereof. In an example the audio controller comprises at least one of an equalization (EQ) controller and a controller for a headphone aware use mode wherein sound external to the headphone is reproduced by the acoustic transducer. In an example the first audio transfer function is measured by providing an audio signal that is configured to operate the acoustic transducer to generate sound, sensing the sound with the feedback microphone, and calculating the first audio transfer function based on the audio signal and the sensed sound, and further wherein the second audio transfer function is calculated based on both the first audio transfer function and the feedback controller. In an example the computer program product further includes providing a measured power spectrum for a microphone located in an ear canal of a person, and providing a measured power spectrum for a microphone located on the person's head, wherein the audio controller calculation is further based on the measured power spectrum for a microphone located in an ear canal of a person, the measured power spectrum for a microphone located on the person's head, and a third audio transfer function between an acoustic transducer and a microphone located in an ear canal of a person.

BRIEF DESCRIPTION OF THE DRAWINGS

Various aspects of at least one example are discussed below with reference to the accompanying figures, which are not intended to be drawn to scale. The figures are included to provide illustration and a further understanding of the various aspects and examples, and are incorporated in and constitute a part of this specification, but are not intended as a definition of the limits of the inventions. In the figures, identical or nearly identical components illustrated in various figures may be represented by a like reference character or numeral. For purposes of clarity, not every component may be labeled in every figure. In the figures.

DETAILED DESCRIPTION

Figure 1:
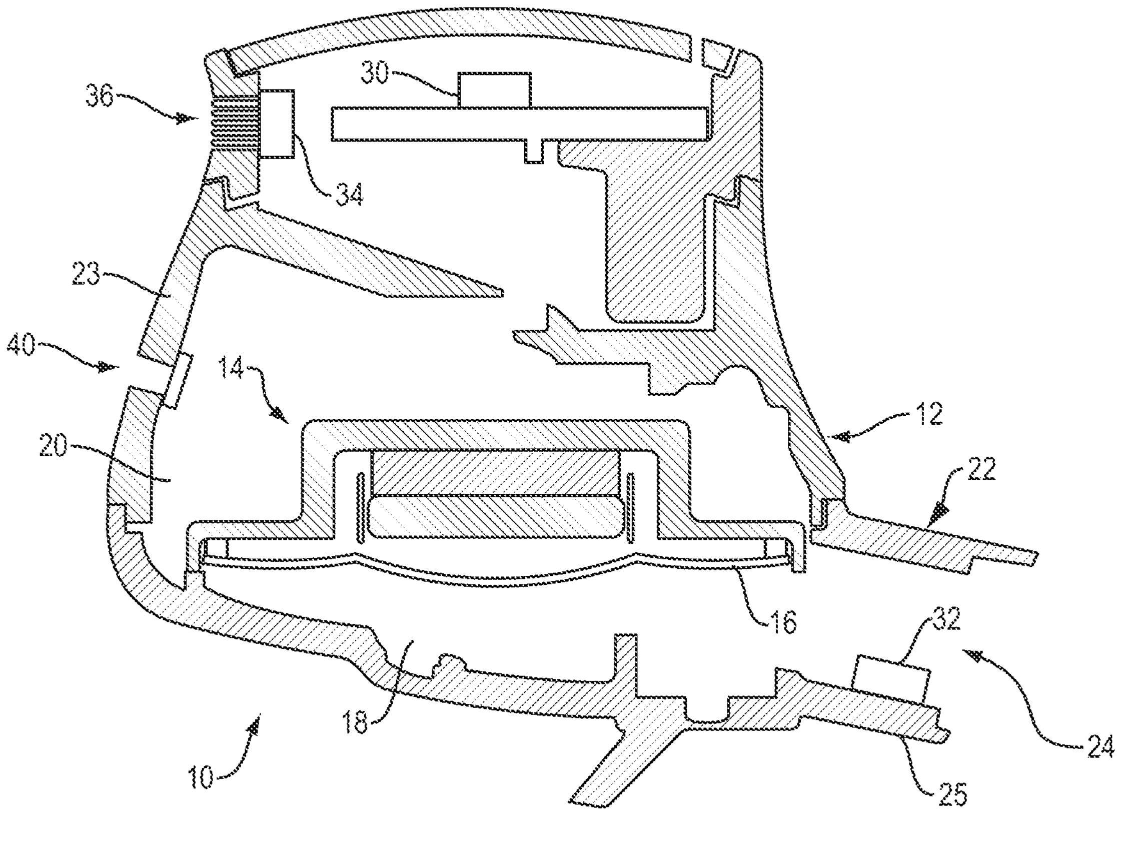
FIG. 1 is a partial cross-sectional view of a headphone.

Examples of the systems, methods and apparatuses discussed herein are not limited in application to the details of construction and the arrangement of components set forth in the following description or illustrated in the accompanying drawings. The systems, methods and apparatuses are capable of implementation in other examples and of being practiced or of being carried out in various ways. Examples of specific implementations are provided herein for illustrative purposes only and are not intended to be limiting. In particular, functions, components, elements, and features discussed in connection with any one or more examples are not intended to be excluded from a similar role in any other examples.

Examples disclosed herein may be combined with other examples in any manner consistent with at least one of the principles disclosed herein, and references to "an example," "some examples," "an alternate example," "various examples," "one example" or the like are not necessarily mutually exclusive and are intended to indicate that a particular feature, structure, or characteristic described may be included in at least one example. The appearances of such terms herein are not necessarily all referring to the same example.

Also, the phraseology and terminology used herein is for the purpose of description and should not be regarded as limiting. Any references to examples, components, elements, acts, or functions of the computer program products, systems and methods herein referred to in the singular may also embrace embodiments including a plurality, and any references in plural to any example, component, element, act, or function herein may also embrace examples including only a singularity. Accordingly, references in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

This disclosure is in part directed to determining audio controllers for headphones such as on ear, over ear or in-ear headphones. The audio controllers can be one or both of headphone equalization (EQ) and headphone aware mode controllers. The controllers are calculated during use of the headphones, using existing headphone components and processing. The calculations are based at least in part on an audio transfer function that is measured between the acoustic transducer of the headphones and a microphone that senses the transducer output (e.g., a feedback microphone in ANR headphones, where the feedback microphone is typically located between the transducer and the user's eardrum). The calculations are further based on this same transfer function, but determined with a feedback controller turned on; this determination can be calculated based on the measured transfer function. A result of this real-time controller calculation is that the EQ and aware mode controllers are customized for the particular user, during use of the headphones, based on a single measured audio transfer function. This provides a more consistent listening experience across large populations of users of the subject headphones.

In an example a first audio transfer function is determined by operating the acoustic transducer of the headphones and sensing the sound with the feedback microphone. The first audio transfer function is calculated based on the audio signal provided to the transducer and based on the sensed sound. The second audio transfer function is determined by measuring an audio transfer function between the acoustic transducer and the feedback microphone, but this time with the headphone feedback controller applied. In an example the second transfer function is calculated based on the audio signal, the sensed sound, and the feedback controller. In an example the second audio transfer function is determined by calculating it based on both the first audio transfer function and the feedback controller.

In a more specific example the calculation of the audio controller is based on data obtained during design of the controller calculation scheme. Such data can be measured in a lab or another controlled environment, across multiple different people and multiple fittings of headphone use on both ears of each person. Measuring on different people provides data relative to many different ear geometries. In an example this data includes a measured power spectrum for a microphone located in the ear canal (which approximates the ear drum), and a separate measured power spectrum for a microphone located on the person's head in a location where it does not interfere with the headphones. The dataset can be developed by placing microphones in the ears of human subjects, and placing a microphone on the subjects' heads. Measurements are made with and without headphones.

In an example there are three measurements made in the lab, and there are two sources of sound for the measurements. In one measurement, the driver in the headphones is used to measure the transfer functions from it to the feedback and canal microphones, while wearing the headset. The other two measurements are made by playing sound from speakers in the measurement room. This is done both with and without the headset worn. For EQ, only the driver measurement and the open room noise measurement is used. For aware mode, all three are used since the response of the outside (feedforward) microphone when the headset is worn is needed.

In an example the lab data is represented by two constant values. These constant values can be derived as further described below.

This disclosure relates to a headphone audio device. Some non-limiting examples of this disclosure describe a type of headphone that is known as an earbud. Earbuds generally include an electro-acoustic transducer for producing sound, and are configured to deliver the sound directly into the user's ear canal. Earbuds can be wireless or wired. In non-limiting examples described herein the earbuds include one or more feedback microphones that sense sound produced by the transducer. Examples also include feedforward (external) microphones that sense external sounds outside of the housing. Feedback and feedforward microphones can be used for functions such as active noise reduction (ANR) where external sounds are canceled so they are not heard, and transparency mode operation where external sounds are reproduced for the user. Aspects of earbuds and other types of headphones that are not involved in this disclosure are not shown or described.

A headphone refers to a device that typically fits around, on, or in an ear and that radiates acoustic energy directly or indirectly into the ear canal. Headphones are sometimes referred to as earphones, earpieces, headsets, earbuds, or sport headphones, and can be wired or wireless. A headphone includes a driver (acoustic transducer) to transduce electrical audio signals to acoustic energy. The driver may or may not be housed in an earcup or in a housing that is configured to be located on the head or on the ear, or to be inserted directly into the user's ear canal. A headphone may be a single stand-alone unit or one of a pair of headphones (each including at least one acoustic driver), one for each ear. A headphone may be connected mechanically to another headphone, for example by a headband and/or by leads that conduct audio signals to an acoustic driver in the headphone. A headphone may include components for wirelessly receiving audio signals. A headphone may include components of an ANR system, which may include an internal microphone within the headphone housing and an external microphone that picks up sound outside the housing. Headphones may also include other functionality, such as additional microphones for an ANR system, or one or more microphones that are used to pick up the user's voice.

One or more of the systems and methods described herein, in various examples and combinations, may be used in a wide variety of headphones in various form factors. One such form factor is an earbud. Another is an on-ear or over-ear headphone.

It should be noted that although specific implementations of headphones primarily serving the purpose of acoustically outputting audio are presented with some degree of detail, such presentations of specific implementations are intended to facilitate understanding through provisions of examples and should not be taken as limiting either the scope of the disclosure or the scope of the claim coverage.

In some examples the headphone includes an electro-acoustic transducer that is configured to develop sound for a user, a housing that holds the transducer, and a feedback microphone that is configured to detect sound in the housing before it reaches the eardrum. A processor system of the headphone is programmed to accomplish methods of determining an audio controller, such as an equalization (EQ) controller and an aware mode controller.

FIG. 1 is a perspective view of a wireless in-ear earbud 10. An earbud is a non-limiting example of a headphone device. Earbud 10 includes body or housing 12 that houses the active components of the earbud. Housing 12 encloses electro-acoustic transducer (audio driver) 14 that generates sound via movable diaphragm 16. Housing 12 comprises front housing portion 22 and rear housing portion 23. Diaphragm 16 is driven in order to create sound pressure in front housing cavity 18. Sound is also created in rear housing cavity 20. Sound pressure is directed from cavity 18 out of front housing portion 22 via sound outlet 24. Internal microphone 32 is located inside of housing 12. In an example microphone 32 is in housing portion 22, as shown in FIG. 1. External microphone 34 is configured to sense sound external to housing 12. In an example exterior microphone 34 is located inside of the housing and is acoustically coupled to the external environment via housing openings 36 that let environmental sound reach microphone 34. In an example interior microphone 32 is used as a feedback microphone for active noise reduction (ANR), and exterior microphone 34 is used as a feed-forward microphone for ANR, and/or for transparency mode operation where environmental sound is sensed and then reproduced to the user so the user is more environmentally aware and can hear others speaking and the like. An earbud typically also includes a pliable tip (not shown) that is engaged with neck 25 of housing portion 22, to help direct the sound into the ear canal. Note that details of earbud 10 and its operation are well known in the technical field and so are not further described herein. Also, details of earbud 10 are exemplary of aspects of headphones and are not limiting of the scope of this disclosure, as the present audio controller can be used in varied types and designs of earbuds, earphones, and other types of headphones.

Earbud 10 also includes processor 30. In some examples processor 30 is configured to process outputs of microphones 32 and 34. In some examples the processor is used to accomplish other processing needed for earbud functionality, such as processing digital sound files that are to be reproduced by the earbud, as would be apparent to one skilled in the technical field. In an example the processor is configured to calculate and then apply the audio controllers disclosed herein. The use of EQ and aware-mode audio controllers is known in the technical field.

In some examples the processor is programmed to calculate an EQ controller and/or an aware mode controller based on an audio transfer function between transducer 14 and feedback microphone 32. The transfer function is determined both with and without the ANR feedback controller applied.

Figure 2:
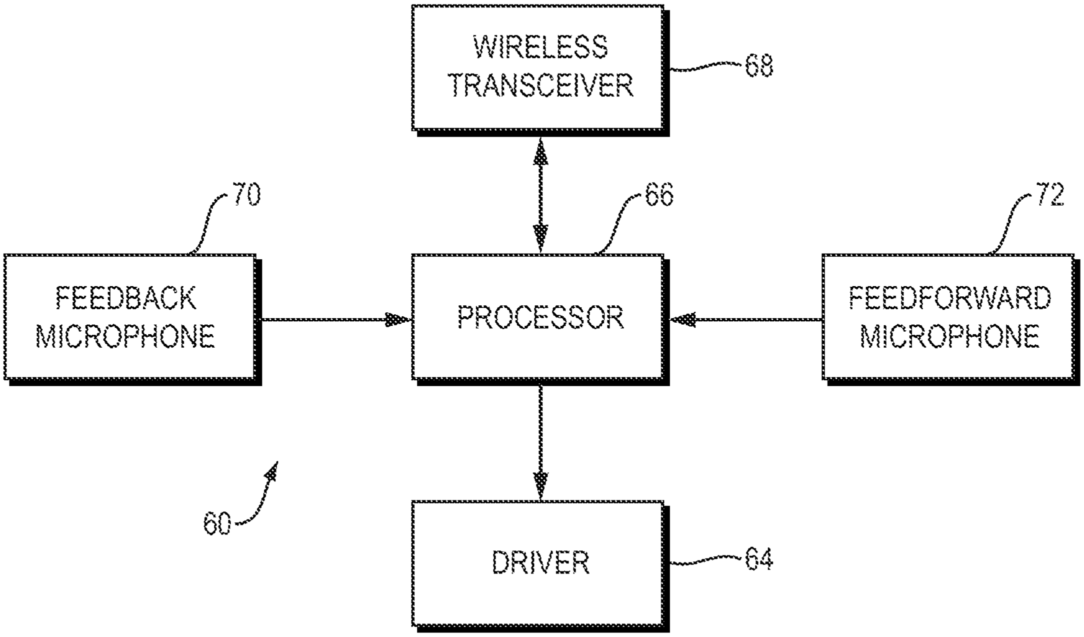
FIG. 2 is a block diagram of aspects of a headphone.

FIG. 2 is a block diagram of aspects of a headphone device 60. In an example device 60 is an earbud, but this is not a limitation of the disclosure as the present disclosure also applies to other types of headphones such as those described herein. Device 60 includes processor 66 that receives audio data from external sources via wireless transceiver 68. Processor 66 also receives the outputs of the feedback microphone(s) 70 and the feedforward microphone(s) 72. Processor 66 outputs audio data that is converted into analog signals that are supplied to audio driver 64. In an example device 60 includes memory comprising instructions that, when executed by the processor, accomplish the calculation and application of the audio controllers, and other processing described herein. In some examples device 60 is configured to store a computer program product using a non-transitory computer-readable medium including computer program logic encoded thereon that, when performed on the headphone device (e.g., by the processor) causes the headphone device to determine the audio controllers as described herein. Note that the details of wearable audio device 60 are exemplary of aspects of headphones and are not limiting of the scope of this disclosure, as the present audio controller methodologies can be used in varied types and designs of earbuds and headphones. Also note that aspects of headphone 60 that are not involved in the present audio controller methodologies are not illustrated in FIG. 2, for the sake of simplicity.

Headphones are typically designed with control schemes that are aimed at providing a preset manufacturer-designed audio response both when music is played and during aware or transparency mode use. Equalization audio controllers are designed to help accomplish a desired target-curve equalization (EQ), so that, at least ideally, the reproduced sound has a desired spectral response. Transparency mode controllers are used to help accomplish a desired transparency sound reproduction; the controllers are typically designed to exactly reproduce the sensed external sounds. In some examples one or both of these audio controllers are stored in device memory and applied by a device controller. Audio controllers and their use in headphones are well known in the field of audio engineering.

However, when the headphones are actually used the user's anatomy (such as the ear anatomy) as well as the way that headphones are worn creates a high degree of variability in the sound that is actually delivered from person to person. Thus, few if any people will actually receive the target sound profiles that are intended by the designed and installed EQ and aware (transparency) mode audio controllers.

In the present audio control system and method, one or both of the EQ and transparency audio controllers are calculated and applied in real time, during use of the headphones. A result is that the user experience is closer to what is intended by the headphone manufacturer, even accounting for variability from user to user. In some examples the audio controller calculation is based on an audio transfer function that is measured while the headphone is in use by the user. This transfer function is between the headphone acoustic transducer or driver and one or more headphone microphone(s) that receive the driver output. In ANR headphones this microphone can be a feedback microphone that is located between the driver and the user's eardrum. In an example, in earbuds this feedback microphone is typically located in the nozzle through which sound is delivered directly into the ear canal. Audio transfer functions and their calculation are well known in the audio field and so are not described in depth. Also, the application of an audio controller by a processor of the headphones is generally ubiquitous in headphones and so is also not described in depth.

Figure 3:
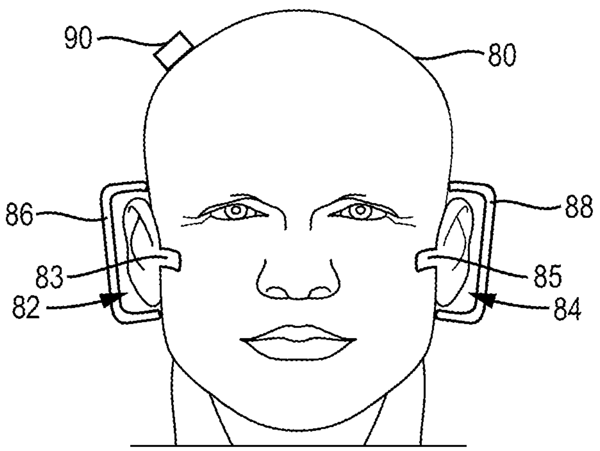
FIG. 3 is a schematic diagram of a person wearing headphones.

FIG. 3 is a schematic representation of a user's head 80 that is useful to understanding the headphone audio controller. Right headphone 86 is located on, over, or in right ear 82 with ear canal 83. Left headphone 88 is located on, over, or in left ear 84 with ear canal 85. Also, microphone 90 is depicted located on the user's head 80 in a location that does not interfere with a headphone. The arrangement of the headphones and the microphone(s) is useful relative to aspects of the audio controller, as is further explained below.

Figure 4:
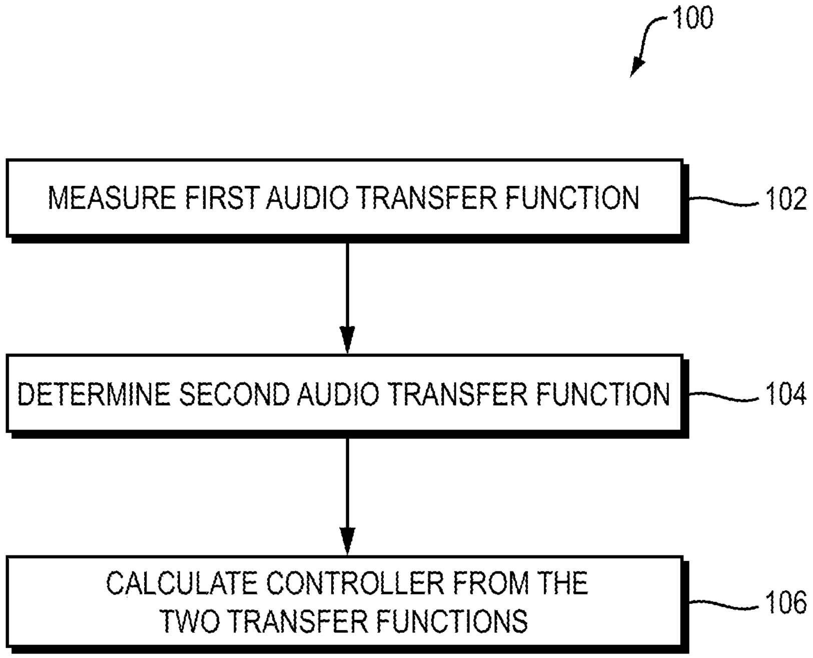
FIG. 4 is a flow chart illustrating a method for calculating an audio controller.

In an example illustrated in FIG. 4, method 100 of determining an audio controller for a headphone device is accomplished using an existing headphone control and sound delivery system, such as processor 66, feedback (or other) microphone 70, and driver 64, FIG. 2. In step 102 an audio transfer function between acoustic transducer 64 and microphone 70 is measured. As is known in the technical field, an audio transfer function measurement in some examples is based on a known audio signal being used to drive the transducer, reception of the resulting sound by the microphone, and calculation of the transfer function between the driver and the microphone. In method 100, at step 104 a second audio transfer function is determined, this time with a feedback controller for the existing headphone ANR system applied. At least one measurement is needed, and the other can be calculated with knowledge of the feedback controller. Feedback controllers are used in headphones with ANR, and are well known in the technical field and so not further described herein. At step 106 the relevant audio controller(s) (one or both of an EQ controller and a transparency mode controller) are calculated based on both the first and second transfer functions.

In an exemplary aware mode controller Kaw, assuming negligible direct sound path due to passive insertion gain and effective ANR, and where the power spectrum Scc of a microphone located in the ear canal is equal to the power spectrum Scc,open, (where "open" means that a headphone is not worn during the measurement), the aware mode controller (termed a "semi-custom" or "sc" controller) may be represented by the following equation (1).

$$|K_{AW,sc}|^2 = \left\langle \frac{s_{cc,open} / s_{rr,open}}{s_{oo} / s_{rr}} \left| \frac{G_{sd}}{G_{cd}} \right|^2 \right\rangle \left| \frac{1}{\tilde{G}_{sd}} \right|^2 \tag{1}$$

where G denotes a transfer function, and when G is used with a tilde it denotes a transfer function with the feedback controller applied. The subscripts used herein are defined as follows: d: driver/speaker signal; s: "system"/feedback microphone; c: canal microphone (microphone placed in the ear canal, which is a stand-in for the ear drum); o: "outside"/ feedforward microphone; r: reference microphone on the head in a location where the presence or not of the headphone/headset does not affect it acoustically. The angled brackets denote an average of the enclosed quantity.

The transfer function subscript annotation standard is from the second subscript to the first. Accordingly, Gsd is the transfer function from driver to feedback microphone. For the power spectra, they generally refer to measurements when the headset is worn, unless the subscript contains an ",open", which means a measurement when the headset is not worn. Srr is a measurement of the reference microphone when the headset is worn. As for the controllers, Kaw is the aware mode controller and Keq is the audio controller. In some cases the absolute values of the controllers are defined. This is because their phase generally does not matter, as long unnecessary phase is not added. In other words, they should be minimum phase. For music, this is well known. But for the aware mode controller, this fact depends on the total noise reduction (passive+feedback+feedforward) being enough that the direct noise arriving at the ear is so low that when the aware mode controller is turned on, what is heard at the ear is completely dominated by the signal coming from Kaw. This is generally the case in many ANR headsets.

An exemplary semi-custom EQ controller may be represented by equation (2) below:

$$|K_{EQ,sc}|^2 = \left\langle \frac{S_{cc,open}}{S_{rr,open}} \left| \frac{G_{sd}}{G_{cd}} \right|^2 \right\rangle \left| \frac{1}{\tilde{G}_{sd}} \right|^2 \quad (2)$$

Thus, by measuring transfer functions between the transducer and one or more microphones of the headphones (both with and without the ANR feedback controller applied) the aware mode and EQ controllers can be calculated and applied on the fly, while the headphone is in use.

The aware mode and EQ controllers may operate more uniformly across multiple users if they are revised to take into account data measured from multiple subjects with multiple fits of the headphones, such as described above relative to laboratory data. Since there is no way to obtain open-ear information from a user in the field, appropriate lab data can be used as a substitute for open ear information. In some examples, Gsd is used to estimate the relationship Sss,open/Srr,open (where Sss,open is the power spectrum expected at the feedback microphone if it were still left in the ear canal in the same location when the earbud has been removed. Since the feedback microphone is removed with the headset, Sss,open is an estimate of what it would have been in such an imagined situation). In an example Sss,open is estimated from Gsd based on an average transfer matrix of the section of the ear that is blocked by an earbud, where the matrix is estimated from the lab data. In an example, constants α and β are used to represent frequency dependent complex quantities derived from the lab data. These constants are determined based on Gsd and a transfer function (Gp1p2) between an outside reference microphone (on the user's head) and a microphone that is in the ear canal at the location of the feedback microphone of an inserted earbud. In an example, Gsd. Gcd, and Scc,open are measured, and Gp1p2 is estimated based on these three measurements.

In an example the constant values can be derived as follows.

If the reference microphone is termed #1 and the feedback microphone #2, the transfer function from 1 to 2 for external noise is termed $G_{P_1P_2}$, it can be stated that (a):

$$|G_{P_1P_2}|^2 = \frac{S_{ss,open}}{S_{rr,open}} \quad (a)$$

From simple modelling, the following (b) can be asserted:

$$G_{P_1P_2} = \frac{G_{sd}}{G_{sd}\alpha + \beta} \quad (b)$$

Also, from the laboratory data the following (c) can be estimated:

$$\frac{S_{ss,open}}{S_{rr,open}} = \frac{S_{cc,open}}{S_{rr,open}} \left| \frac{G_{sd}}{G_{cd}} \right|^2 \quad (c)$$

Then, to solve for the best a and a and c are combined to derive (d):

$$|G_{P_1P_2}| = \sqrt{\frac{S_{cc,open}}{S_{rr,open}}} \left| \frac{G_{sd}}{G_{cd}} \right| \quad (d)$$

To remove the absolute value around $G_{P_1P_2}$, some phase is added to the expression on the right of (d). Possible examples are giving it zero phase at all frequencies or calculating a minimum phase that matches the magnitude. The result is $G_{P_1P_2}$ for every fit in the lab data. Even though every fit ideally should have different α's and β's, one of each is chosen for use in the headphones, which can be accomplished by developing a best fit to the data on average.

Now, (b) is rearranged to give (e):

$$G_{P_1P_2}G_{sd}\alpha + G_{P_1P_2}\beta = G_{sd} \quad (e)$$

Using this equation (e) for every fit, a matrix equation of the type $$Ax=b$$

Can be set up. Then solve for the best least mean square fit using the pseudo-inverse of A:

$$x=A^{\dagger}b$$

Or in terms of the equation above, using all the fits in the lab data:

$$\begin{bmatrix} G_{P_1P_2}^{fit1} G_{sd}^{fit1} & G_{P_1P_2}^{fit1} \\ G_{P_1P_2}^{fit2} G_{P_1P_2}^{fit2} & G_{P_1P_2}^{fit2} \\ \vdots & \vdots \end{bmatrix} \begin{bmatrix} \alpha \\ \beta \end{bmatrix} = \begin{bmatrix} G_{sd}^{fit1} \\ G_{sd}^{fit2} \\ \vdots \end{bmatrix}$$

$$\begin{bmatrix} \alpha \\ \beta \end{bmatrix} = \begin{bmatrix} G_{P_1P_2}^{fit1} G_{sd}^{fit1} & G_{P_1P_2}^{fit1} \\ G_{P_1P_2}^{fit2} G_{P_1P_2}^{fit2} & G_{P_1P_2}^{fit2} \\ \vdots & \vdots \end{bmatrix} = \begin{bmatrix} G_{sd}^{fit1} \\ G_{sd}^{fit2} \\ \vdots \end{bmatrix}$$

This gives an optimized solution that works best across the population on average.

Taking the laboratory data into account in this way leads to revised or "enhanced" aware mode and EQ controllers, set forth in equations (3) and (4), respectively. Note that the desired controller shape is calculated frequency by frequency, based on the controller design.

$$|K_{AW,enh}|^2 = \left\langle \frac{S_{rr}}{S_{oo}} \right\rangle \left| \frac{G_{sd}}{G_{sd}\alpha + \beta} \right|^2 \left| \frac{1}{\tilde{G}_{sd}} \right|^2 \quad (3)$$

$$|K_{EQ,enh}|^2 = \left| \frac{G_{sd}}{G_{sd}\alpha + \beta} \right|^2 \left| \frac{1}{\tilde{G}_{sd}} \right|^2 \quad (4)$$

Theoretical "optimal" or "opt" controllers include a microphone in the ear canal and so cannot be implemented on a headphone user. The optimal controllers are useful for an understanding of the semi-custom and enhanced controllers disclosed herein. Optimal aware mode and EQ controller equations are set forth in equations (5) and (6), respectively.

$$|K_{AW,opt}|^2 = \frac{S_{cc,open} / S_{rr,open}}{S_{oo} / S_{rr}} \left| \frac{1}{\tilde{G}_{cd}} \right|^2 \quad (5)$$

This is further multiplied by overall target shapes (e.g. filtering out low frequencies below voice band and high frequencies to avoid instabilities when moving hands near headset).

$$|K_{EQ,opt}|^2 = \frac{S_{cc,open}}{S_{rr,open}} \left| \frac{1}{\tilde{G}_{cd}} \right|^2 \quad (6)$$

This is further multiplied by an overall target, which may be similar to the target curve for speakers in a room but with some tweaks given that a headset is being used.

Figure 5:
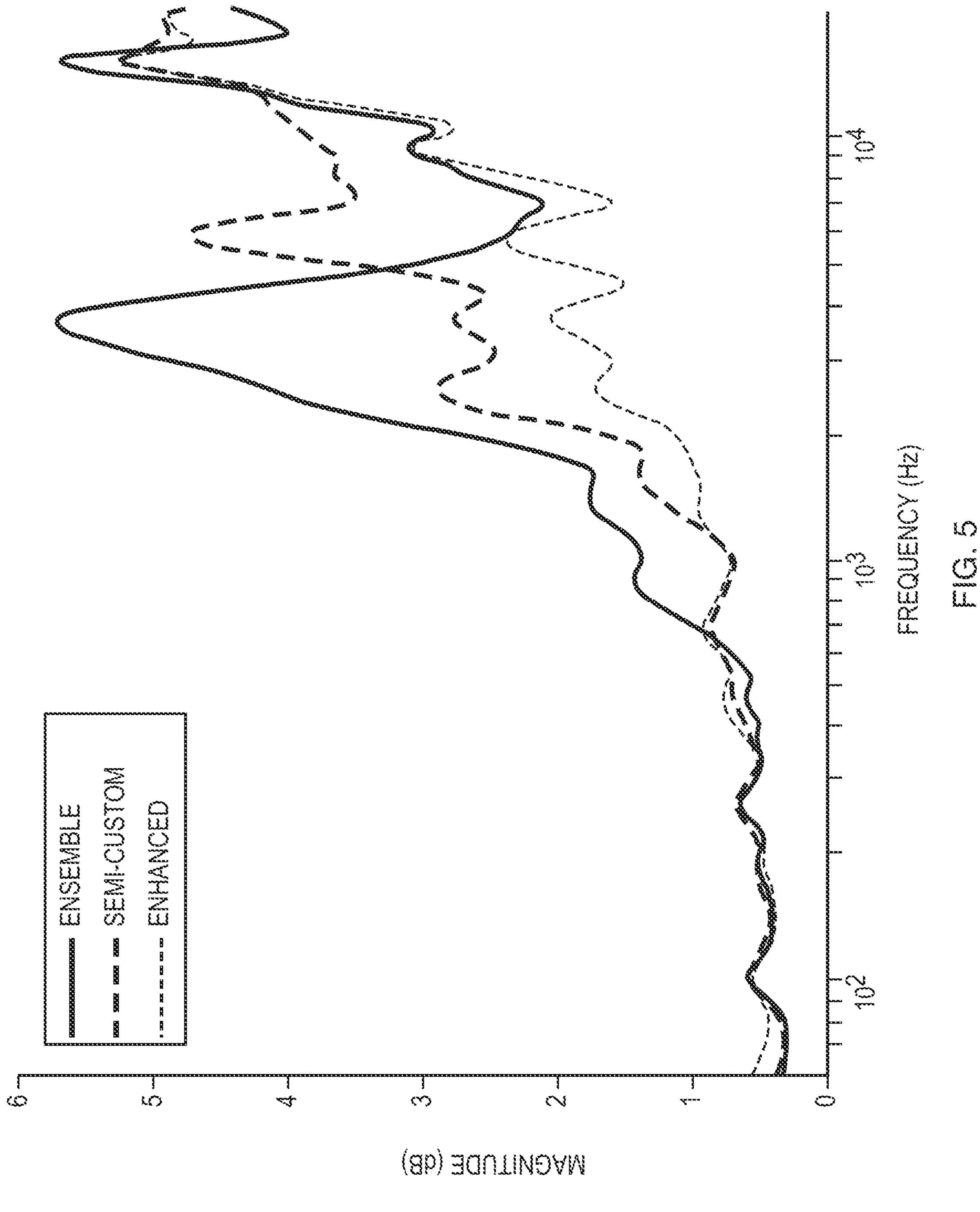
FIG. 5 is a plot of the logarithmic standard deviation of third octave smoothed aware mode insertion gain in ANR earbuds with and without exemplary audio controllers.

FIG. 5 illustrates the standard deviation of total insertion gain (in dB) for an earbud with and without (termed "ensemble mode") the exemplary semi-custom and enhanced aware mode controllers set forth in equations (1) and (2). This evidences that from about 700 Hz to about 7 kHz the performance is improved using either of these aware mode controllers.

Figure 6:
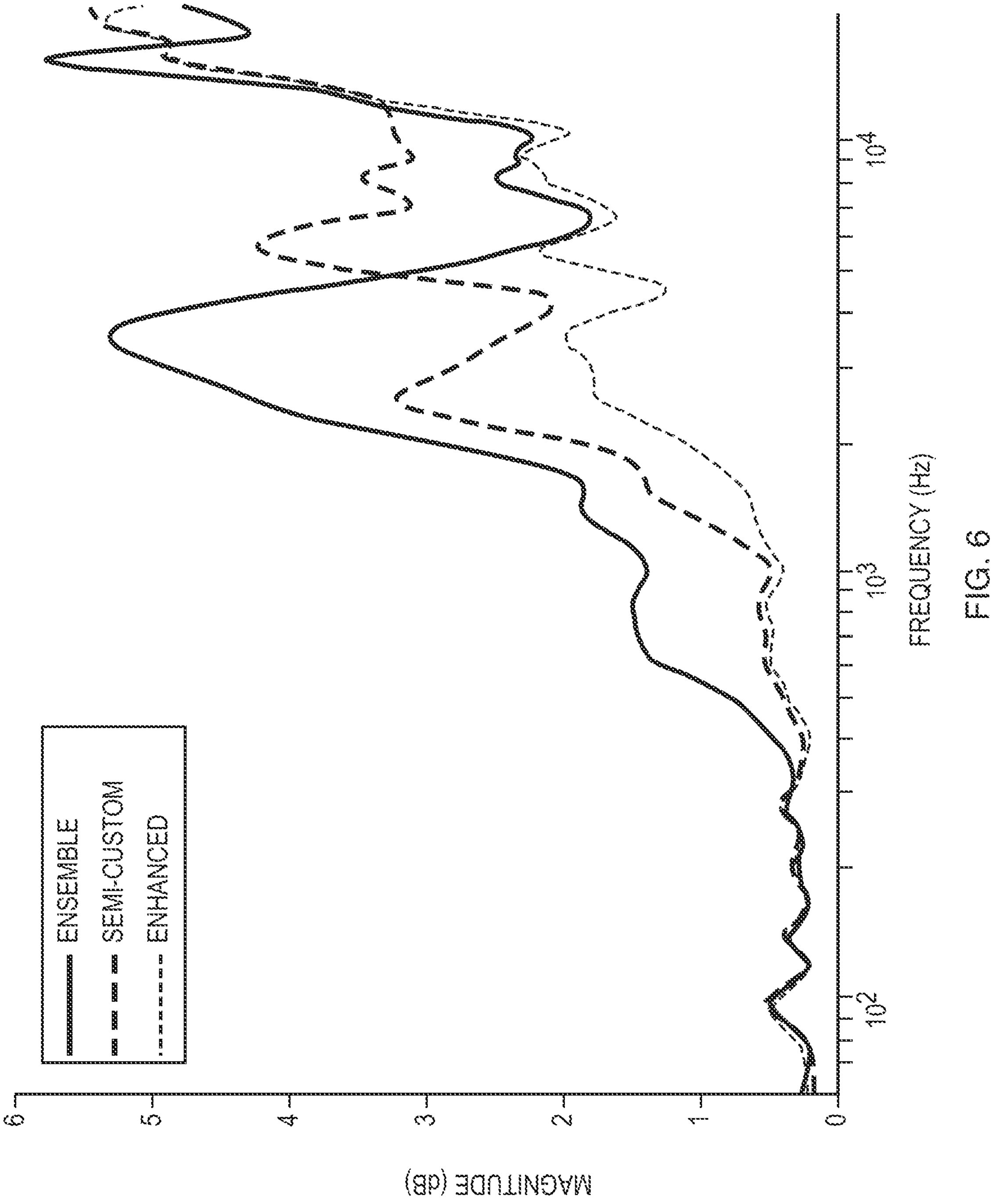
FIG. 6 is a plot of the logarithmic standard deviation of third octave smoothed EQ mode insertion gain in ANR earbuds with and without exemplary audio controllers.

FIG. 6 illustrates the standard deviation of total insertion gain (in dB) for an earbud with and without (termed "ensemble mode") the exemplary semi-custom and enhanced EQ mode controllers set forth in equations (3) and (4). This evidences that from about 300 Hz to about 5 kHz the performance is improved using either of these EQ mode controllers.

The subject audio controller determination and application is able to improve both EQ and aware mode uses of headphones. The calculation of the controller(s) is based on real-time measurement of the audio transfer function between an audio transducer of the headphone and one or more microphones of the headphone that are configured to receive the transducer output. Accordingly, the controller(s) are at least in part customized for the particular user of the headphones, and the current use of the headphones. A result is that the aware mode and/or EQ performance of the headphones is demonstrably closer to the desired designed target performance. The headphones thus provide performance that is closer to standard across different users as compared to headphones with pre-set aware mode and EQ controllers.

Note that as long as there is a suitable microphone in the headset, the present approaches to determining audio controllers is not limited to the existence of a feedback loop for the EQ mode. For aware mode the need to remove all direct noise from outside may not be likely without a feedback loop present, but a feedforward loop alone with passive sound attenuation could potentially suffice.

Also note that this disclosure could use multiple microphones, including on the outside of the headset (for aware mode), which could involve adding them up simply or using them in an array fashion to have directional aware mode/hearing, as well as multiple feedback microphones.

Further, the subject EQ and aware mode controllers can be injected in two places: at the driver (disturbance injection) or before the feedback controller (command injection). Both can be used, with complementary filters in place.

Elements of figures are shown and described as discrete elements in a block diagram. These may be implemented as one or more of analog circuitry or digital circuitry. Alternatively, or additionally, they may be implemented with one or more microprocessors executing software instructions. The software instructions can include digital signal processing instructions. Operations may be performed by analog circuitry or by a microprocessor executing software that performs the equivalent of the analog operation. Signal lines may be implemented as discrete analog or digital signal lines, as a discrete digital signal line with appropriate signal processing that is able to process separate signals, and/or as elements of a wireless communication system.

When processes are represented or implied in the block diagram, the steps may be performed by one element or a plurality of elements. The steps may be performed together or at different times. The elements that perform the activities may be physically the same or proximate one another, or may be physically separate. One element may perform the actions of more than one block. Audio signals may be encoded or not, and may be transmitted in either digital or analog form. Conventional audio signal processing equipment and operations are in some cases omitted from the drawing.

Examples of the systems and methods described herein comprise computer components and computer-implemented steps that will be apparent to those skilled in the art. For example, it should be understood by one of skill in the art that the computer-implemented steps may be stored as computer-executable instructions on a computer-readable medium such as, for example, hard disks, optical disks, Flash ROMS, nonvolatile ROM, and RAM. Furthermore, it should be understood by one of skill in the art that the computer-executable instructions may be executed on a variety of processors such as, for example, microprocessors, digital signal processors, gate arrays, etc. For ease of exposition, not every step or element of the systems and methods described above is described herein as part of a computer system, but those skilled in the art will recognize that each step or element may have a corresponding computer system or software component. Such computer system and/or software components are therefore enabled by describing their corresponding steps or elements (that is, their functionality), and are within the scope of the disclosure.

Functions, methods, and/or components of the methods and systems disclosed herein according to various aspects and examples may be implemented or carried out in a digital signal processor (DSP) and/or other circuitry, analog or digital, suitable for performing signal processing and other functions in accord with the aspects and examples disclosed herein. Additionally or alternatively, a microprocessor, a logic controller, logic circuits, field programmable gate array(s) (FPGA), application-specific integrated circuits) (ASIC), general computing processor(s), micro-controller(s), and the like, or any combination of these, may be suitable, and may include analog or digital circuit components and/or other components with respect to any particular implementation.

Functions and components disclosed herein may operate in the digital domain, the analog domain, or a combination of the two, and certain examples include analog-to-digital converters) (ADC) and/or digital-to-analog converter(s) (DAC) where appropriate, despite the lack of illustration of ADC's or DAC's in the various figures. Further, functions and components disclosed herein may operate in a time domain, a frequency domain, or a combination of the two, and certain examples include various forms of Fourier or similar analysis, synthesis, and/or transforms to accommodate processing in the various domains.

Any suitable hardware and/or software, including firmware and the like, may be configured to carry out or implement components of the aspects and examples disclosed herein, and various implementations of aspects and examples may include components and/or functionality in addition to those disclosed. Various implementations may include stored instructions for a digital signal processor and/or other circuitry to enable the circuitry, at least in part, to perform the functions described herein.

Having described above several aspects of at least one example, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A method of determining an audio controller for a headphone that is configured to use an acoustic transducer to develop sound that is delivered to an ear of a user and that includes a feedback microphone that is configured to sense sound developed by the acoustic transducer, the method comprising:

- measuring a first audio transfer function between the acoustic transducer and the feedback microphone;
- determining a second audio transfer function between the acoustic transducer and the feedback microphone with a feedback controller applied; and
- calculating the audio controller based on both the first audio transfer function and the second audio transfer function.

2. The method of claim 1 wherein measuring the first audio transfer function comprises providing an audio signal that is configured to operate the acoustic transducer to generate sound, sensing the sound with the feedback microphone, and calculating the first audio transfer function based on the audio signal and the sensed sound.

3. The method of claim 1 wherein determining the second audio transfer function comprises measuring an audio transfer function between the acoustic transducer and the feedback microphone with a feedback controller applied.

4. The method of claim 3 wherein measuring an audio transfer function between the acoustic transducer and the feedback microphone with a feedback controller applied comprises providing an audio signal that is configured to operate the acoustic transducer to generate sound, sensing the sound with the feedback microphone, and calculating the second audio transfer function based on the audio signal, the sensed sound, and the feedback controller.

5. The method of claim 1 wherein determining the second audio transfer function comprises calculating the second audio transfer function based on both the first audio transfer function and the feedback controller.

6. The method of claim 5 wherein the audio controller comprises an equalization (EQ) controller.

7. The method of claim 5 wherein the audio controller comprises a controller for a headphone use mode wherein sound external to the headphone is reproduced by the acoustic transducer.

8. The method of claim 1 further comprising providing a measured power spectrum for a microphone located in an ear canal of a person, and providing a measured power spectrum for a microphone located on the person's head.

9. The method of claim 8 wherein the calculation of the audio controller is further based on both the measured power spectrum for a microphone located in an ear canal of a person and the measured power spectrum for a microphone located on the person's head.

10. The method of claim 9 wherein the calculation of the audio controller is further based on a third audio transfer function between an acoustic transducer, and a microphone located in an ear canal of a person.

11. The method of claim 1 further comprising providing a third audio transfer function between a first location of a feedback microphone in an ear canal of a person and a second location on the person's head.

12. The method of claim 11 further comprising providing a fourth audio transfer function between the acoustic transducer and the first location of a feedback microphone in an ear canal of a person.

13. The method of claim 12 further comprising providing first and second constant values.

14. The method of claim 13 wherein the first and second constant values are calculated based on both the third and fourth audio transfer functions.

15. The method of claim 14 wherein the first and second constant values are calculated based on both the third and fourth audio transfer functions at multiple different fits of the headphone on multiple different people.

16. The method of claim 13 wherein the first and second constant values represent frequency-dependent complex quantities.

17. A computer program product having a non-transitory computer-readable medium including computer program logic encoded thereon that, when performed on a headphone that is configured to use an acoustic transducer to develop sound that is delivered to an ear of a user and that includes a feedback microphone that is configured to sense sound developed by the acoustic transducer, causes the headphone to:

- measure a first audio transfer function between the acoustic transducer and the feedback microphone;
- determine a second audio transfer function between the acoustic transducer and the feedback microphone with a feedback controller applied; and
- calculate the audio controller based on both the first audio transfer function and the second audio transfer function.

18. The computer program product of claim 17 wherein the audio controller comprises at least one of an equalization (EQ) controller and a controller for a headphone use mode wherein sound external to the headphone is reproduced by the acoustic transducer.

19. The computer program product of claim 18 wherein the first audio transfer function is measured by providing an audio signal that is configured to operate the acoustic transducer to generate sound, sensing the sound with the feedback microphone, and calculating the first audio transfer function based on the audio signal and the sensed sound, and further wherein the second audio transfer function is calculated based on both the first audio transfer function and the feedback controller.

20. The computer program product of claim 19 further comprising providing a measured power spectrum for a microphone located in an ear canal of a person, and providing a measured power spectrum for a microphone located on the person's head, wherein the audio controller calculation is further based on the measured power spectrum for a microphone located in an ear canal of a person, the measured power spectrum for a microphone located on the person's head, and a third audio transfer function between an acoustic transducer and a microphone located in an ear canal of a person.

* * * * *